(12) United States Patent
Parker et al.

(10) Patent No.: US 6,707,713 B1
(45) Date of Patent: Mar. 16, 2004

(54) INTERLACED MULTI-LEVEL MEMORY

(75) Inventors: Allan Parker, Austin, TX (US); Joseph Skrovan, Buda, TX (US); Brett Gerhardt, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/516,478

(22) Filed: Mar. 1, 2000

(51) Int. Cl.$^7$ ................................................ G11C 16/04
(52) U.S. Cl. ............................. 365/185.03; 365/185.2; 365/185.24
(58) Field of Search ..................... 365/185.03, 185.18, 365/185.2, 185.24, 185.33

(56) References Cited

U.S. PATENT DOCUMENTS

| | | | | |
|---|---|---|---|---|
| 5,172,338 A | * | 12/1992 | Mehrotra et al. | 365/185.03 |
| 5,262,984 A | * | 11/1993 | Noguchi et al. | 365/185.03 |
| 5,302,870 A | | 4/1994 | Chern | 307/530 |
| 5,429,968 A | | 7/1995 | Koyama | 437/48 |
| 5,457,650 A | | 10/1995 | Sugiura et al. | 365/184 |
| 5,523,972 A | | 6/1996 | Rashid et al. | 365/185.22 |
| 5,566,125 A | * | 10/1996 | Fazio et al. | 365/185.03 |
| 5,596,526 A | | 1/1997 | Assar et al. | 365/185.17 |
| 5,602,789 A | | 2/1997 | Endoh et al. | 365/201 |
| 5,689,679 A | | 11/1997 | Jouppi | 395/449 |
| 5,740,104 A | * | 4/1998 | Forbes | 365/185.03 |
| 5,751,634 A | * | 5/1998 | Itoh | 365/185.18 |
| 5,815,436 A | | 9/1998 | Tanaka et al. | 365/185.03 |
| 5,831,900 A | | 11/1998 | Miyamoto | 365/185.03 |
| 5,847,992 A | | 12/1998 | Tanaka et al. | 365/185.03 |
| 5,852,575 A | | 12/1998 | Sugiura et al. | 365/184 |
| 5,949,101 A | | 9/1999 | Aritome | 257/315 |
| 5,986,929 A | | 11/1999 | Sugiura et al. | 365/185.03 |
| 6,023,781 A | | 2/2000 | Hazama | 714/773 |
| 6,026,015 A | | 2/2000 | Hirakawa | 365/185.03 |
| 6,028,792 A | | 2/2000 | Tanaka et al. | 365/185.22 |
| 6,044,004 A | * | 3/2000 | Kramer | 365/185.03 |
| 6,148,363 A | * | 11/2000 | Lofgren et al. | 365/185.33 |
| 6,151,246 A | * | 11/2000 | So et al. | 365/185.24 |

FOREIGN PATENT DOCUMENTS

| | | | |
|---|---|---|---|
| EP | 0661711 A1 | 7/1995 | G11C/11/56 |
| EP | 0740305 A2 | 10/1996 | G11C/11/56 |
| EP | 1020869 A1 | 7/2000 | G11C/11/56 |
| WO | WO 99/07000 | 2/1999 | |

* cited by examiner

Primary Examiner—Trong Phan
(74) Attorney, Agent, or Firm—Wagner Murabito & Hao LLP

(57) ABSTRACT

A memory device having a plurality of multi-bit cells that are programmed with interlaced data provide superior read access time. The multi-bit cells are read by reading the first bit of each of the plurality of cells sequentially using a first reference voltage then reading the second bit of a first subset of the plurality of cells sequentially using a second reference voltage then reading the second bit of a second subset of the plurality of cells sequentially using a third reference voltage. The second reference voltage being higher and the third reference voltage being lower than the first reference voltage.

18 Claims, 3 Drawing Sheets

| Program Level | State | Bit 0 (MSB) | Bit 1 (LSB) | Stored Data |
|---|---|---|---|---|
| -2.5V | A | 0 | 0 | 00 |
| 0.0V | B | 0 | 1 | 01 |
| +1.0V | C | 1 | 0 | 10 |
| +2.0V | D | 1 | 1 | 11 |

INTERLACED MULTI-LEVEL MEMORY

BACKGROUND

A flash memory cell can be a field effect transistor (FET) that includes a select gate, a floating gate, a drain, and a source. A cell can be read by grounding the source, and applying a voltage to a bitline connected with the drain. By applying a voltage to the wordline connected to the select gate, the cell can be switched on and off.

Flash memory cells include NAND type and NOR type circuits. NAND flash memory cells have "n" cell transistors connected in series and are connected in parallel between bit lines and ground lines. NAND flash memory cells are useful in large scale integration. NOR flash memory cells include cell transistors that are connected in parallel between bit lines and ground lines. NOR flash memory cells provide high-speed operation.

Programming a cell includes trapping excess electrons in the floating gate to increase voltage. This reduces the current conducted by the memory cell when the select voltage is applied to the select gate. The cell is programmed when the cell current is less than a reference current when the select voltage is applied. The cell is erased when the cell current is greater than the reference current and the select voltage is applied.

Memory cells with only two programmable states contain only a single bit of information, such as a "0" or a "1". A multi-level cell ("MLC") is a cell that can be programmed with more than one voltage level. Each voltage level is mapped to corresponding bits of information. For example, a single multilevel cell can be programmed with one of four voltage levels, e.g. −2.5V, 0.0V, +1.0V, +2.0V that correspond to binary bits "00", "01", "10", and "11", respectively. A cell that is programmable at more voltage levels can store more bits of data based on Eqn. 1.

$$N=2B \qquad \text{Eqn.1}$$

B is the number of bits of data stored

N is the number of voltage levels.

The amount of data stored in a cell can be increased by using more programming states. Thus, two or more bits of data are stored in each cell. A cell with four states requires three threshold levels. U.S. Pat. Nos. 5,043,940 and 5,172,338 describe such cells and are incorporated herein by reference. More time is required to program a cell with more states to avoid overshooting a desired smaller programming range.

FIG. 1 shows a diagram of a multi-level cell's programming voltage levels 100 with four voltage distributions ("programming voltage levels") 102, 104,106, and 108. For illustration purposes, the voltage distributions 102 104,106, and 108 are referred to as "state A" "state B" "state C" and "state D", respectively. They correspond to the two-bit binary values "00" "01" "10" and "11", respectively.

BRIEF SUMMARY OF THE PREFERRED EMBODIMENTS

A memory device having a plurality of multi-bit cells that are programmed with interlaced data provide superior read access time. The multi-bit cells are read by reading the first bit of each of the plurality of cells sequentially using a first reference voltage then reading the second bit of a first subset of the plurality of cells sequentially using a second reference voltage then reading the second bit of a second subset of the plurality of cells sequentially using a third reference voltage. The second reference voltage being higher and the third reference voltage being lower than the first reference voltage.

BRIEF DESCRIPTION OF SEVERAL VIEWS OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION OF THE PREFERRED EMBODIMENTS

To improve read access time, data is stored in multi-bit memory cells in an interlaced format. The interlaced format allows a first bit to be read from each multi-bit memory cell using a first reference voltage and reference current. The second bit (and any subsequent bit(s)) is then read from each multi-bit cell with either a second or third reference voltage depending on the value of the first bit of interlaced data from that cell. Optionally, the same reference current can be used for all reads, thus reducing the read circuit complexity.

Figures 1, 2:
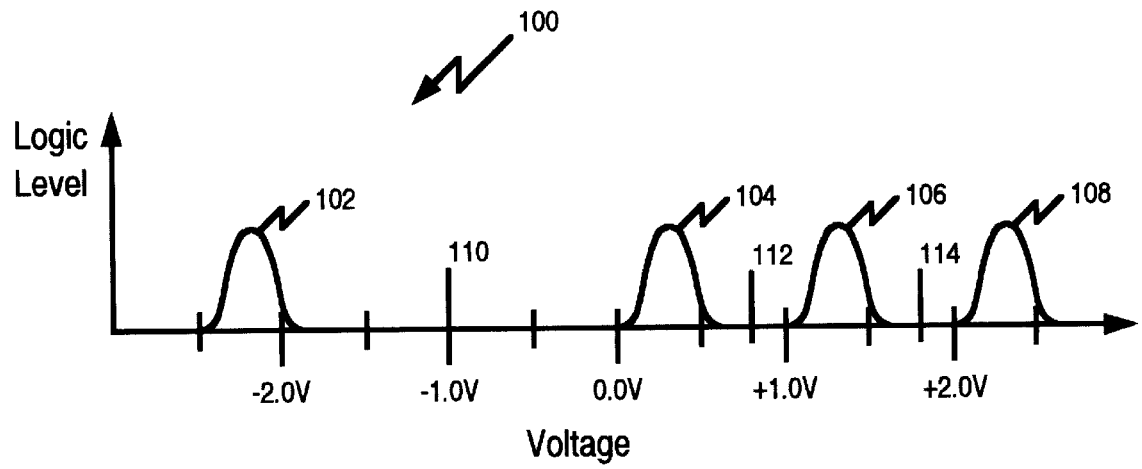
FIG. 1 is a diagram of a multi-level cell's programming voltage levels.
FIG. 2 is a diagram of a multi-level cell's sense current levels, states, and stored data.

Multilevel memory cells can be read by a series of consecutive reads. FIG. 1 shows a four level multi-level cell with four programming levels 102, 104, 106, and 108. The reference voltages 110, 112, and 114 can be used during the reading of the cell to determine the stored value in the cell. For example a two pass read would use reference voltage 112. If the first read detected the stored voltage level was above the reference voltage 112, then the second read would use the higher reference voltage 114. The read would then be able to detect if the stored voltage level was above or below the reference voltage 114. Alternatively, if the first read using the reference voltage 112 detected that the stored voltage level was below the reference level 112, then a lower reference level 110. The second read then can detect if the stored voltage level is above or below the reference level 110. Thus, two reads, similar to two single bit reads, can determine which of the four voltage levels is stored in the cell. The voltage level of each cell is determined then the value of the next cell is determined. This requires applying two reference voltages to read the two bits stored in each cell.

The terms "multi-bit cell" and "multi-bit cell" are used interchangeably. The term "two-bit cell" is a type of multi-bit cell that can be programmed with at least two bits of information.

Multi-bit memory cells are commonly grouped together in pages, subpages, or arrays. Once the memory cells are grouped, the data is divided. In the case of two-bit cells, the data will be divided in half into two equal subsets. If the cells contain more than two bits, the data is divided by the number of bits each cell can store. The data is interlaced such that the first subset of data is stored in the first bit of each cell and the second subset of data is stored in the second bit of each cell and so forth.

For example, assuming the memory includes one hundred two-bit cells and can therefore store 200 bits of data. The 200 bits of data are divided into two subsets. The first subset includes the first 100 bits of data and the second subset includes the last 100 bits of data. The first subset of data is stored in the first bit, that is the most significant bit ("MSB"), of each of the one hundred two-bit cells and the second subset of data is stored in the second bit, that is the least significant bit ("LSB"), of each of the one hundred two-bit cells. Thus, the first two-bit cell will contain the data from the first bit of the one hundred bits in the first subset and the first bit of the one hundred bits in the second subset, which is the bit 101 of the original two hundred bits. This is contrasted to conventional two-bit cell systems where the first two-bit cell contains the first two bits of the two hundred bits.

It is advantageous to read the MSB of all the cells first because the speed comparable to single bit can be achieved for the MSB.

FIG. 2 shows a diagram illustrating one possible relationship between the four program voltage level, the four state labels and the stored data. Continuing the example from above, if the first bit of the first subset is a "1" and the first bit of the second subset is a "0" then binary "10" is the value stored in the first multi-bit cell, which corresponds to state C and program voltage level 1.0V.

Figure 3:
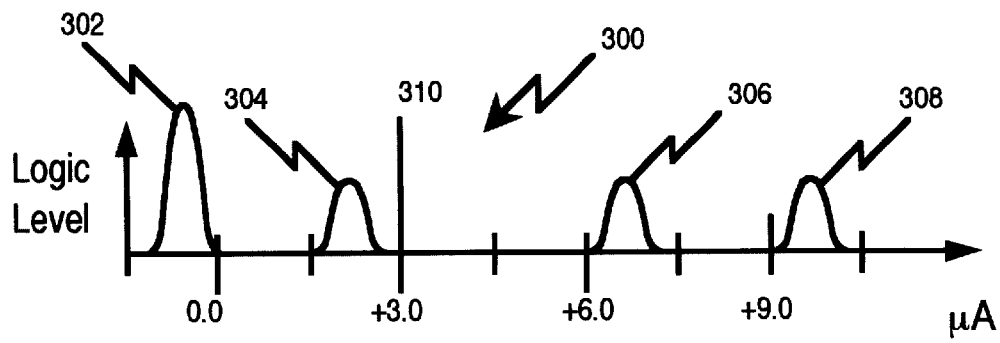
FIG. 3 is a diagram of a multi-level cell's sense current levels during the first read.

FIG. 3 shows a diagram of a multi-level cell's sense current levels 300 during the first read of the cells. Sense current (Ids) distributions 302, 304, 306, and 308 correspond to states A, B, C, and D, respectively. During the first read of the cells, the wordline voltage(Vg) is 1.0V. If the cell conducts, the MSB must be a "1" which corresponds to either state C or D. The cell will conduct if the current is greater than the reference current 310. At this point, in accordance to FIG. 2, the MSB of all the cells can be read without changing the reference voltage.

The first read is repeated for all cells in the group using the same reference voltage. This allows the first half of the data to be read without changing the wordline voltage and avoids the delays associated with changing the voltage such as rise time delay.

Figure 4:
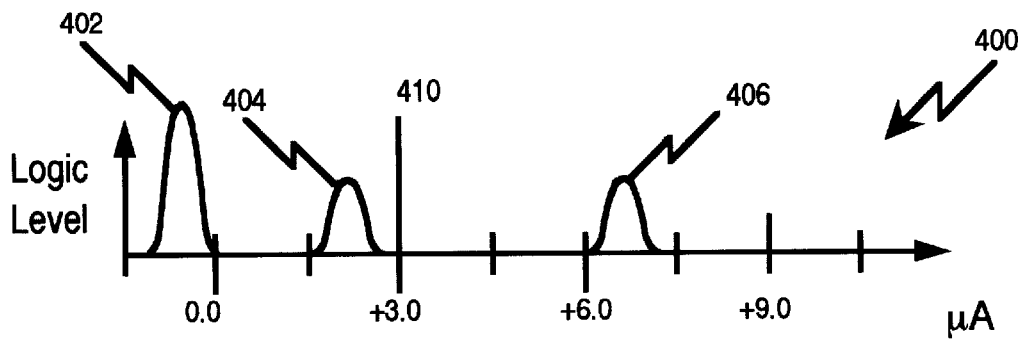
FIG. 4 is a diagram of a multi-level cell's sense current levels during the second read.

FIG. 4 shows a diagram 400 of a multi-level cell's sense current during the second read. Sense current distributions 402 corresponds to states A and B. Sense current levels 404 and 406 correspond to states C and D, respectively. If the first read of this cell conducted, meaning that the first bit (bit 0, MSB) was "1", then the wordline voltage (Vg) of 2.0V is used for the second read because the cell must be programmed with state C or D. If the cell conducts during the second read, then the second bit (bit 1, LSB) is "1" and that cell is in state D. If the cell did not conduct during the second read, then the second bit is "0" and that cell is in state C. The cell will conduct if the current is greater than the reference current 410.

Figure 5:
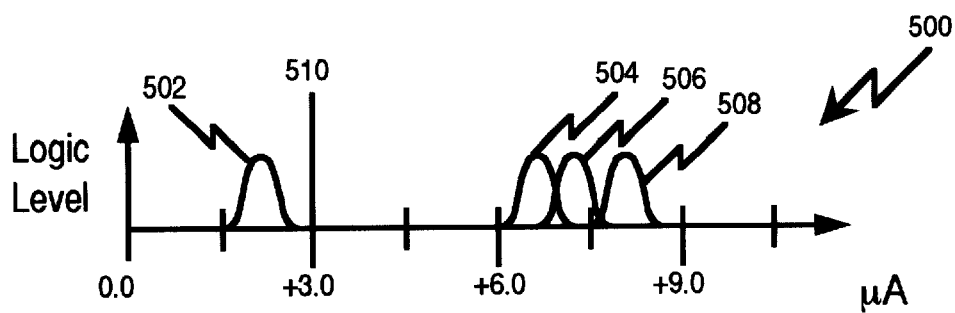
FIG. 5 is a diagram of a multi-level cell's sense current levels during the third read.

FIG. 5 shows a diagram 500 of a multi-level cell's sense current levels during the second read when the first read was "0". Sense current distributions 502, 504, 506 and 508 correspond to states A, B, C and D, respectively. If the first read of this cell did not conduct meaning that the first bit (bit 0, MSB) was "0", then the wordline voltage (Vg) of 0.0V is used because the cell must be programmed with state A or B. If the cell conducts during the second read, then the second bit (bit 1) is "1" and that cell is in state B. If the cell did not conduct then the second bit is "0" and that cell is in state A. The cell will conduct if the current is greater than the reference current 510.

The reference currents 310 (FIG. 3), 410 (FIG. 4), and 510 (FIG. 5) used for the current threshold can be the same current level. For example, 3 micro amps (3 $\mu A$). By maintaining the same current threshold, the multi-bit cell sensing is greatly simplified. The sensing design can be fine tuned for a single current threshold in a lower bit-wise resistance through the NAND chain. The reduces resistance generates larger program distributions and greater reliability.

Interlacing the data allows for a single pass read to access all of the MSBs. This can make the read access speed of the multi-level cell compatible and comparable with existing single-bit devices.

Figure 6:
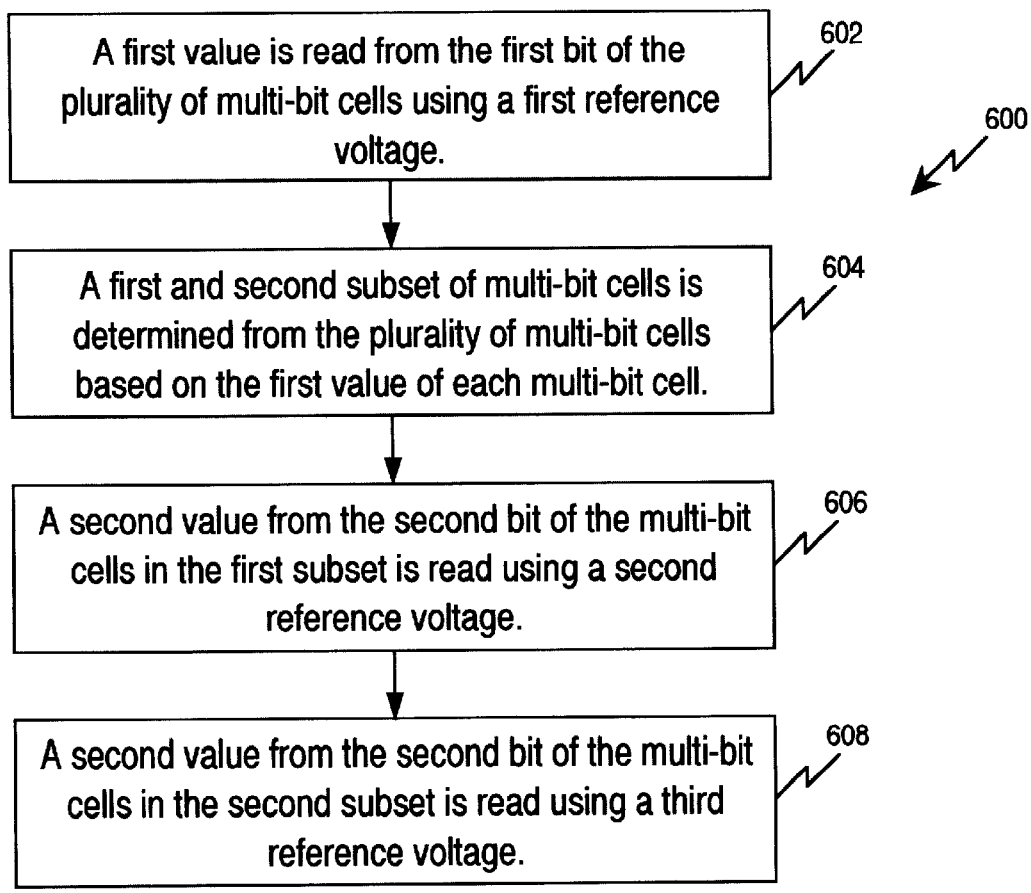
FIG. 6 is a flow diagram of an embodiment of the read process.

FIG. 6 is a flow diagram of an embodiment of the read process 600. In 602, a first value is read from the first bit of the plurality of multi-bit cells using a first reference voltage. In 604, a first and second subset of multi-bit cells is determined from the plurality of multi-bit cells based on the first value of each multi-bit cell. In 606, a second value from the second bit of the multibit cells in the first subset is read using a second reference voltage. In 608, a second value from the second bit of the multi-bit cells in the second subset is read using a third reference voltage.

Figure 7:
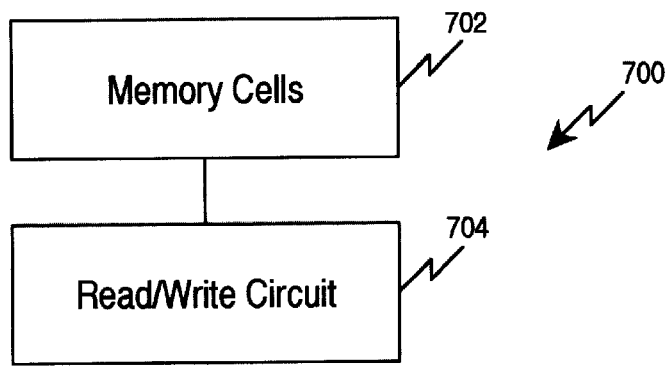
FIG. 7 is a representation of an embodiment of a memory device.

FIG. 7 is a representation of an embodiment of a memory device 700. The memory device 700 includes memory cells 702 and a read/write circuit 704. The memory cells 702 include one or more multi-bit cells each cell storing at least a first and second bit. The read/write circuit 704 can be an integrated unit or two separate units. The read/write circuit 704 writes interlaced data to the plurality of multi-bit cells. The read/write circuit 704 reads interlaced data from the plurality of multi-bit cells.

The term "circuit" includes devices that are solely hardware or software, or a combination of hardware and software. Circuit is not limited to logic circuits or electrical circuit.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A memory device comprising:
a plurality of memory cells for storing data, wherein said data is stored using a plurality of programming voltage levels and wherein said memory cells each comprise a multi-bit cell storing a plurality of bits, and wherein said data is interlaced by dividing said data into a plurality of subsets, correspondingly apportioning said subsets among said voltage levels wherein one bit of data from each of said subset is stored in one of said memory cells; and
a read/write circuit coupled to said memory cells for storing said data to and extracting said data from said plurality of memory cells, wherein said data is read from and written to each of said cells in a sequence corresponding to said apportionment by a sense current distribution of a reference current, wherein said reference current is constant for reading each of said plurality of bits, upon detection of said voltage level stored within each said cell, such that one bit of data from each subset is read from and written to each said cell of said plurality, and wherein stored said data is read from each of said cells on two sequential passes.

2. The memory device as recited in claim 1, wherein said subsets are apportioned among said cells in a first sequence, wherein said first sequence comprises a most significant bit of each of said plurality of memory cells, and in a second sequence, wherein said second sequence comprises a least significant bit of said plurality of memory cells.

3. The memory device as recited in claim 1, wherein said data is extracted from said memory cells by a second sequence of consecutive reads.

4. The memory device as recited in claim 3, wherein second said sequence comprises $2^B$ stages, and wherein all of said data in each said subset is read from each said subset in one of each said stages.

5. The memory device as recited in claim 4, wherein said reads comprises application of a series of sequentially changing voltages.

6. The memory device as recited in claim 5, wherein said series of sequentially changing voltages comprises $2^B$ voltage levels.

7. The memory device as recited in claim 1, wherein said voltage level is programmable.

8. The memory device as recited in claim 7, wherein said voltage level is programmable to at least four different voltage levels.

9. The memory device as recited in claim 7, wherein said read/write circuit is operable to read a value of said data stored in said memory cell by executing a method comprising the steps of:

reading said first bit, wherein a value of said first bit is determined using a first reference voltage and a reference current; and reading a Bth bit, wherein said Bth bit is read using a Bth reference voltage and a reference current, wherein said Bth reference voltage is dependent upon said value of said first bit.

10. In a memory device for storing data comprising a plurality of memory cells for storing data, wherein said data is stored using a plurality of programming voltage levels and wherein said memory cells each comprise a multi-bit cell for storing a plurality of bits of said data, and a read/write circuit coupled to said memory cells for storing said data to and extracting said data from said plurality of memory cells, a method of storing and reading data comprising:

interlacing said data by dividing said data into a plurality of subsets;

apportioning said plurality of subsets correspondingly among said voltage levels wherein one bit of data from each of said subset is stored in one of said memory cells at one of said plurality of voltage levels; and reading said data is from each of said cells in a sequence corresponding to said apportionment by a sense current distribution of a reference current, wherein said reference current is constant for reading each of said plurality of bits, upon detection of said voltage level stored within each said cell, such that one bit of data from each subset is read from and written to each said cell of said plurality, and wherein stored said data is read from each of said cells on two sequential passes.

11. The method as recited in claim 10, wherein said subsets are apportioned among said cells in a first sequence, wherein said first sequence comprises a most significant bit of each of said plurality of memory cells, and in a second sequence, wherein said second sequence comprises a least significant bit of said plurality of memory cells.

12. The method as recited in claim 10, wherein said data is extracted from said memory cells by a second sequence of consecutive reads.

13. The method as recited in claim 12, wherein second said sequence comprises $2^B$ stages, and wherein all of said data in each said subset is read from each said subset in one of each said stages.

14. The method as recited in claim 13, wherein said reads comprise application of a series of sequentially changing voltages.

15. The method as recited in claim 14, wherein said series of sequentially changing voltages comprises $2^B$ voltage levels.

16. The method as recited in claim 10, wherein said voltage level is programmable.

17. The method as recited in claim 16, wherein said voltage level is programmable to at least four different voltage levels.

18. The method as recited in claim 16, wherein said read/write circuit is operable to read a value of said data stored in said memory cell by executing a method comprising the steps of:

reading said first bit, wherein a value of said first bit is determined using a first reference voltage and a reference current; and reading a Bth bit, wherein said Bth bit is read using a Bth reference voltage and a reference current, wherein said Bth reference voltage is dependent upon said value of said first bit.

* * * * *